United States Patent
Chou et al.

(10) Patent No.: US 10,852,265 B2
(45) Date of Patent: Dec. 1, 2020

(54) SURFACE POTENTIAL MEASUREMENT OF DIELECTRIC MATERIALS IN PLASMA

(71) Applicant: University of Southern California, Los Angeles, CA (US)

(72) Inventors: Kevin Chou, Los Angeles, CA (US); Joseph Wang, Los Angeles, CA (US)

(73) Assignee: UNIVERSITY OF SOUTHERN CALIFORNIA, Los Angeles, CA (US)

( * ) Notice: Subject to any disclaimer, the term of this patent is extended or adjusted under 35 U.S.C. 154(b) by 240 days.

(21) Appl. No.: 16/015,047

(22) Filed: Jun. 21, 2018

(65) Prior Publication Data
US 2018/0372666 A1     Dec. 27, 2018

Related U.S. Application Data

(60) Provisional application No. 62/524,400, filed on Jun. 23, 2017.

(51) Int. Cl.
| | |
|---|---|
| *G01N 27/26* | (2006.01) |
| *G01N 27/62* | (2006.01) |
| *G01R 29/24* | (2006.01) |
| *G01R 29/12* | (2006.01) |
| *G01R 19/00* | (2006.01) |
| *G01N 27/22* | (2006.01) |
| *G01R 15/16* | (2006.01) |

(52) U.S. Cl.
CPC .......... *G01N 27/26* (2013.01); *G01N 27/221* (2013.01); *G01N 27/62* (2013.01); *G01R 19/0061* (2013.01); *G01R 29/12* (2013.01); *G01R 29/24* (2013.01); *G01R 15/165* (2013.01); *G01R 19/0084* (2013.01)

(58) Field of Classification Search
None
See application file for complete search history.

(56) References Cited

U.S. PATENT DOCUMENTS

2008/0283507 A1*   11/2008   Kitagawa ............ H01L 21/3105
                                                                    219/121.36

FOREIGN PATENT DOCUMENTS

SU               1678456 A1 *   9/1991

\* cited by examiner

*Primary Examiner* — Paresh Patel
(74) *Attorney, Agent, or Firm* — Snell & Wilmer LLP

(57) ABSTRACT

A system for voltage measurement of dielectric material in plasma includes a vacuum chamber. The system also includes an electrostatic receiver located outside of the vacuum chamber. The system also includes a conductive probe having a first terminus in contact with the dielectric material in the vacuum chamber and a second terminus in electrical communication with the electrostatic receiver. The system also includes a non-contact electrostatic voltmeter configured to measure a floating potential of the electrostatic receiver that corresponds to a dielectric potential of the dielectric material at a location in contact with the first terminus of the conductive probe.

20 Claims, 12 Drawing Sheets

| WIRE LEVEL | HEIGHT (cm) |
|---|---|
| h1 | 0.08 |
| h2 | 0.16 |
| h3 | 0.24 |
| h4 | 0.32 |

| X-POSITION (mm) | $\Phi_p$ (V) | $n_i$ (m$^{-3}$) | $n_e$ (m$^{-3}$) | $T_e$ (eV) |
|---|---|---|---|---|
| 177.8 | 0.0 | $9.1 \times 10^{13}$ | $5.4 \times 10^{13}$ | 2.4 |
| 228.6 | -2.4 | $7.3 \times 10^{13}$ | $3.8 \times 10^{13}$ | 1.7 |
| 279.4 | -3.9 | $6.4 \times 10^{13}$ | $3.1 \times 10^{13}$ | 3.2 |
| 330.2 | -4.7 | $6.1 \times 10^{13}$ | $2.4 \times 10^{13}$ | 2.1 |

| CASES | DUST THICKNESS (cm) | DUST SURFACE POTENTIAL (V) | PLATE FLOATING POTENTIAL (V) | PLATE POTENTIAL CHANGE VS.CLEAN PLATE (%) |
|---|---|---|---|---|
| CLEAN PLATE | ... | ... | -12.74 | ... |
| h2 DUST LAYER | 0.16 | -12.22 | -13.89 | -9.4 |
| h4 DUST LAYER | 0.32 | -13.38 | -15.13 | -18.9 |

FIG. 12

| DUST THICKNESS | $Q_{TOTAL}$ (e) | $\sigma$ (e/m$^2$) | $Q_4$ (e) |
|---|---|---|---|
| h2 DUST LAYER | $3.3 \times 10^9$ | $2.2 \times 10^{11}$ | $1.7 \times 10^3$ |
| h4 DUST LAYER | $2.4 \times 10^9$ | $1.6 \times 10^{11}$ | $1.3 \times 10^3$ |

FIG. 13

SURFACE POTENTIAL MEASUREMENT OF DIELECTRIC MATERIALS IN PLASMA

CROSS-REFERENCE TO RELATED APPLICATIONS

This application claims the benefit and priority of U.S. Provisional Application No. 62/524,400, entitled "SURFACE POTENTIAL MEASUREMENT OF DIELECTRIC MATERIALS IN PLASMA," filed on Jun. 23, 2017, the entire disclosure of which is hereby incorporated by reference herein in its entirety.

BACKGROUND

1. Field

The present disclosure relates to systems and methods for determining voltage potential of dielectric materials in plasma and, more particularly, for determining surface potential of dust in an outer space environment.

2. Description Of The Related Art

Spacecraft charging has been a subject of extensive investigations over the past decades, and dust charging has been a subject of substantial studies in recent years. However, most studies on spacecraft charging have focused on the charging of a "clean" surface in a plasma, and previous studies on dust charging have focused on the charging of single, isolated dust grains. When a spacecraft is in a dusty environment, where the inter-dust grain distances are smaller than or comparable to the plasma Debye length, such as that found near comets and certain asteroids, or on the surfaces of asteroids, the Moon, Mars, etc., its surfaces will be covered by a layer of dust particles ("dusty surface" condition), and the spacecraft surface potential becomes dependent on both the charging of the dust layer and the current balance condition. For a "dusty surface" condition, the charge of individual dust grains will be strongly affected by that of neighboring grains and the surface potential, unlike the charging of single, isolated dust grains, which is only dependent on current collection.

Elastomers or other polymeric materials are typically dielectric and will accumulate charge. Working in a charged suit in the near vacuum of space or other near vacuum environments in which plasmas predominate the surrounding medium introduces a risk of destructive static discharge. Accordingly, designers of suits or other dielectric coverings for human or robotic agents need to accurately predict the surface potential of dielectric materials in near vacuum, plasma environments, including in dusty surface conditions. However, prior test methods have been unable to accurately measure surface potential of dielectric materials having dusty surface conditions in plasma. Researchers have been unable to obtain measurements that agree with theoretical predictions. Hence, designers of dielectric coverings or other articles for use in dusty plasma environments have been deprived of empirical data on which to base their designs. In addition, measurements of surface potential using a non-contacting probe in a vacuum chamber, such as, for example, a Trek™ electrostatic voltmeter (ESVM) have also yielded unreliable measurements, because the need to turn off the plasma source to read the probe result in transient effects that introduce measurement errors.

It would be desirable, therefore, to provide more effective systems and methods for measuring surface potential of dielectric materials in plasma under dusty surface conditions, or using a non-contacting ESVM in a plasma chamber.

SUMMARY

Described herein is a system for voltage measurement of dielectric material in plasma. The system includes a vacuum chamber. The system also includes an electrostatic receiver located outside of the vacuum chamber. The system also includes a conductive probe having a first terminus in contact with the dielectric material in the vacuum chamber and a second terminus in electrical communication with the electrostatic receiver. The system also includes a non-contact electrostatic voltmeter configured to measure a floating potential of the electrostatic receiver that corresponds to a dielectric potential of the dielectric material at a location in contact with the first terminus of the conductive probe.

Also disclosed is a method for voltage measurement of a dielectric material in plasma. The method includes placing the dielectric material in a vacuum chamber. The method also includes positioning a conductive probe such that a first terminus of the conductive probe is in contact with the dielectric material. The method also includes coupling a second terminus of the conductive probe to an electrostatic receiver outside of the vacuum chamber. The method also includes generating plasma in the vacuum chamber. The method also includes measuring a voltage of the dielectric material at the electrostatic receiver using a non-contact electrostatic voltmeter.

Also disclosed is a system for voltage measurement of dielectric material in plasma. The system includes a vacuum chamber. The system also includes a support shelf located in the vacuum chamber and configured to support the dielectric material. The system also includes a plasma source configured to generate plasma into the vacuum chamber. The system also includes an electrostatic receiver located outside of the vacuum chamber. The system also includes a first conductive probe having a first terminus in contact with the dielectric material in the vacuum chamber and a second terminus in electrical communication with the electrostatic receiver. The system also includes a non-contact electrostatic voltmeter configured to measure a floating potential of the electrostatic receiver that corresponds to a dielectric potential of the dielectric material at a location in contact with the first terminus of the first conductive probe.

BRIEF DESCRIPTION OF THE DRAWINGS

Other systems, methods, features, and advantages of the present invention will be or will become apparent to one of ordinary skill in the art upon examination of the following figures and detailed description. Additional figures are provided in the accompanying Appendix and described therein.

FIG. 12 is a chart illustrating aluminum plate floating potential and dust surface potential according to an embodiment of the present disclosure;

FIG. 13 is a table illustrating total charge on a dust layer and charge per dust grain according to an embodiment of the present disclosure.

DETAILED DESCRIPTION

The potential of a clean conductor in plasma can be obtained by measuring its current-voltage characteristics. The potential of a solid dielectric surface in plasma can be measured by methods utilizing contacting probes or a Trek™ non-contacting electrostatic voltmeter (ESVM). The surface potential of a dust layer can also be measured using a Trek™ non-contacting ESVM. However, the potential of the surface underneath a dust layer has not been measured due to a lack of viable experimental methods. Currently, there is very limited knowledge on plasma charging of a dust covered surface.

The present disclosure describes systems and methods for measuring a charging of a conducting surface covered by a thin layer of dielectric dust grains in plasma. The method utilizes conducting wires embedded within the dust layer and a Trek™ non-contacting ESVM, which directly measures the potential of a dust covered conducting plate and the potentials within the dust layer. In the present disclosure, the embedded wires are connected to a measurement plate outside the vacuum chamber, and the floating potential of the measurement plate is measured by a Trek™ non-contacting ESVM. Embedded wires are placed at the dust surface to measure the surface's floating potential and at different heights within the dust layer to obtain the qualitative potential profile inside the dust layer.

The systems and methods are applied to measure plasma charging of an aluminum plate covered by a JSC-1A lunar regolith simulant. The plasma environment considered is that of cold beam ions and thermal electrons with the ion beam velocity parallel to the target plate surface. This simulates the near-surface solar wind plasma at the lunar terminator, where the plasma is a mesothermal flow and impinges the lunar surface at a near 0 degree angle of attack.

Figure 1:
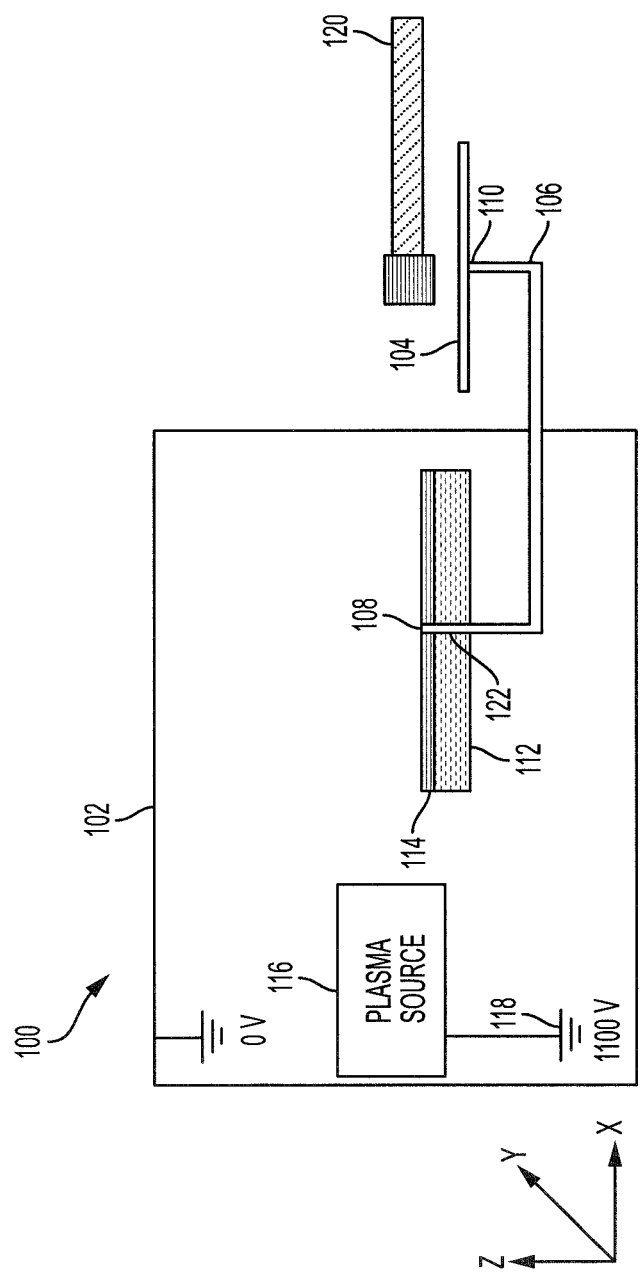
FIG. 1 is a block diagram illustrating a system for voltage measurement of a dielectric material in plasma according to an embodiment of the present disclosure.

Referring now to FIG. 1, an exemplary system 100 is shown. The system 100 includes a vacuum chamber 102, an electrostatic receiver 104, conductive probes 106, a support shelf 112, a plasma source 116, and a dielectric material 114. The support shelf 112 may support the dielectric material 114 and may define a plurality of openings 122 through which the conductive probes 106 may extend.

The conductive probes 106 may each include a first terminus 108 and a second terminus 110. The first terminus 108 may extend through a corresponding opening 122 and be in contact with the dielectric material 114. The first terminus 108 of each of the conductive probes 106 may be located at a similar height above the support shelf 112 or at different heights above the support shelf 112.

The second terminus 110 of each of the conductive probes 106 may be coupled to the electrostatic receiver 104. A non-contacting electrostatic voltmeter (ESVM) 120 may be used to measure the potential at the electrostatic receiver 104, which corresponds to the potential of the dielectric material 114 at the first terminus 108 of the corresponding conductive probe 106.

The plasma source 116 may be connected to a power supply 118 which may supply power to the plasma source 116. The plasma source 116 may generate plasma into the vacuum chamber 102 where it may contact the dielectric material 114.

Figure 2:
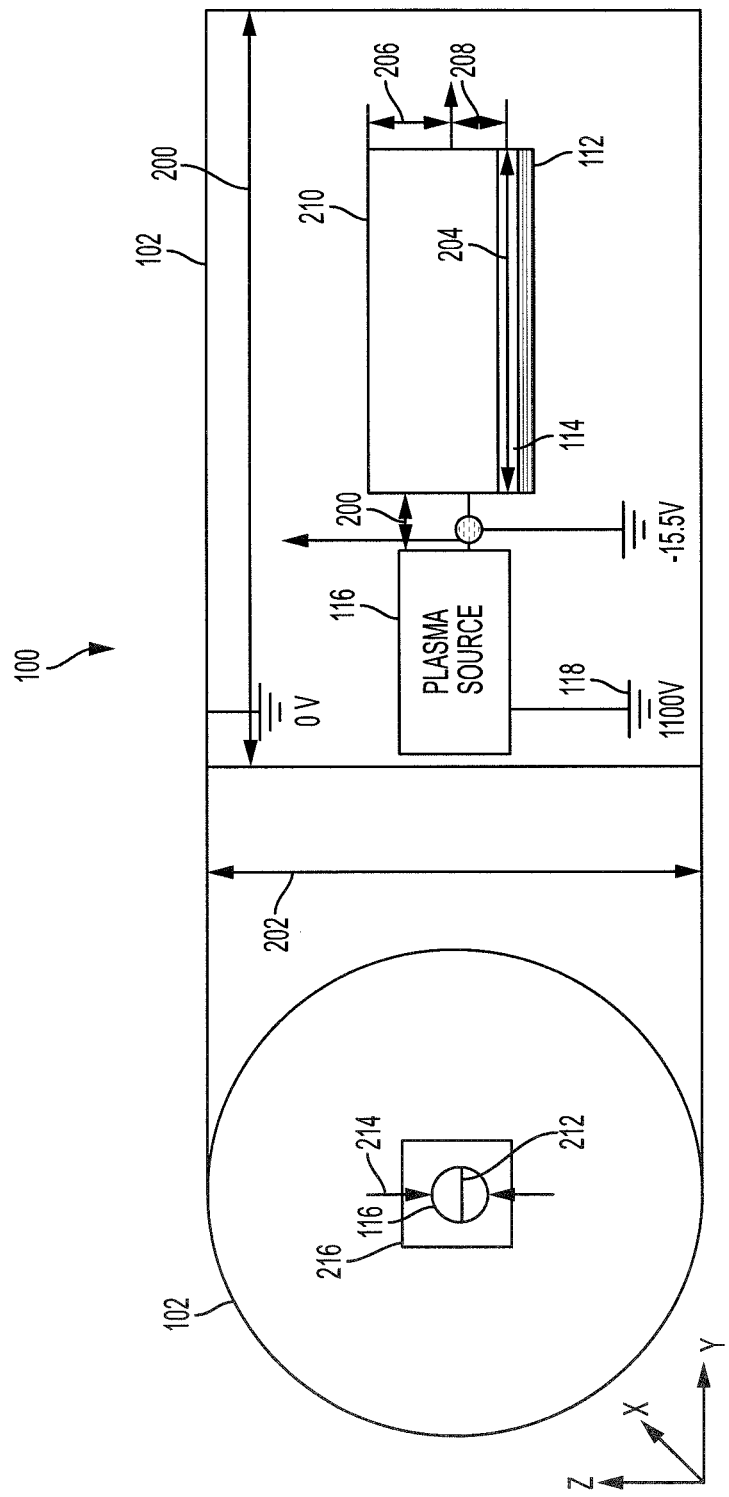
FIG. 2 is a block diagram illustrating another view of the system of FIG. 1 according to an embodiment of the present disclosure.

In some embodiments and referring to FIG. 2, the vacuum chamber 102 may be a cylindrical, stainless steel vacuum chamber. The vacuum chamber 102 may have a diameter 202 that is between 27.5 inches (70 centimeters (cm)) and 43.3 inches (110 cm), between 31.5 inches (80 cm) and 39.4 inches (100 cm), or about 36 inches (91.4 cm). Where used in this context, about refers to the reference to value plus or minus 10 percent of the referenced value.

The vacuum chamber 102 may have a length 200 that is between 39.4 inches (100 cm) and 55.1 inches (140 cm), between 43.3 inches (110 cm) and 51.2 inches (130 cm), or about 48 inches (122 cm).

In some embodiments, a mechanical pump may be used for roughing, and a cryogenic pump may be used to bring the vacuum chamber 102 to a relatively high vacuum. For example, the cryogenic pump may include a CVI TM500 cryogenic pump with a pumping speed of 8500 liters per second. In some embodiments, the pressure within the vacuum chamber 102 may be maintained between $10^{-7}$ and $10^{-6}$ Torr.

The plasma source 116 may include, for example, an electron bombardment griddled ion thruster with a hot filament neutralizer 212 placed along a centerline of the vacuum chamber 102. The plasma source 116 may have a diameter 214 of, for example, between 0.79 inches (2 cm) and 3.1 inches (8 cm), between 1.2 inches (3 cm) and 2.0 inches (5 cm), or about 1.6 inches (4 cm).

In the plasma source 116, argon gas may flow through a back of an ionization chamber 216 and thermal electrons emitted from a hot tungsten filament surface may ionize the neutral argon gas. The ionization chamber 216 may be biased, for example to 1100 V above ground, and an anode cup may be biased, for example to 50 V higher than the ionization chamber 216 to absorb any low energy electrons that exist after collisions. Ion optics may be used to accelerate the ions, and a hot-filament neutralizer 212 placed directly downstream of the source generated neutralizing electrons. The plasma source 116 may be run at 10 milliamps with 2.5 SCCM of argon gas flow for experiments.

Referring to FIGS. 1 and 2, the dielectric material 114 may include dust grains. The dust grain used in experiments included JSC-1A lunar regolith simulant, which possesses low electrical conductivity and dielectric losses, similar to actual lunar soil. The relative permittivity of JSC-1A is 3.6-4.22. Dust grains were sifted to ensure that only dust grains between 0.0024 inches (60 micrometers) and 0.004 inches (100 micrometers) in diameter were used.

The present disclosure considers charging in a plasma environment of cold ions and thermal electrons. In an experimental setup, the support shelf 112 was placed a distance 200 downstream of the plasma source (x-direction, the distance 200 was 7.0 inches (17.8 cm)) and a distance 208 below the centerline of the plasma source (z-direction, the distance 208 was 1 inch (2.54 cm)). The support shelf 112 was oriented parallel to the plasma beam direction and included an aluminum plate. Because the cold ion plasma beam had about a 0 degree angle of attack with respect to the target sample, the plasma current collected at the surface of the support shelf 112 was approximately of cold ions and thermal electrons.

In order to correlate surface charging potentials to the ambient plasma environment, the plasma plume generated by the plasma source 116 was also measured. The plasma environment was measured in a region 210 that is located a first distance 204 in the axial direction by a second distance 206 in the radial direction, a third distance 208 above the support shelf 112 using an electrostatic Langmuir probe and Faraday probe. The first distance 204 was 5 inches (12.7 cm), the second distance 206 was 3 inches (7.62 cm), and the third distance 208 was 1 inch (2.54 cm). The scanning area 210 was divided into 91 measurement points with a spatial resolution of 0.5 inches by 0.5 inches (1.27 cm by 1.27 cm). An emissive probe scanned a region 5 inches (12.7 cm) in the axial direction by 3.1 inches (7.86 cm) in the radial direction, 0.29 inches (0.74 cm) above the support shelf 112 to capture the ambient plasma potential and sheath potential above the sample. The scanning area was divided into 286 measurement points with a spatial resolution of 0.024 inches (0.06 cm) by 0.5 inches (1.27 cm) within the sheath, and 0.5 inches by 0.5 inches (1.27 cm by 1.27 cm) above the sheath. These probes were placed on a 3-D traversing system that moved the probes with an accuracy of 1 mil to obtain a 2-D plasma flow field profile in the scanning area.

The support shelf 112 was electrically floating with respect to the plasma environment and the chamber ground. To determine the effects of dust accumulation on surface charging, the experiments compared the floating potential of a clean plate with the floating potential of a plate covered by a layer of dust. The floating potential of the support shelf 112 was measured by connecting a wire from the support shelf 112 to the electrostatic receiver 104 (which included another aluminum plate, or measurement plate) outside of the chamber. The non-contact electrostatic voltmeter 120 (a Trek™ non-contacting ESVM) then measured the floating potential of the measurement plate outside the vacuum chamber. Placing the ESVM outside of the chamber allowed for measurement of the floating potential of the support shelf 112 during source operation while avoiding interference from Trek™ probe charging.

Figure 3:
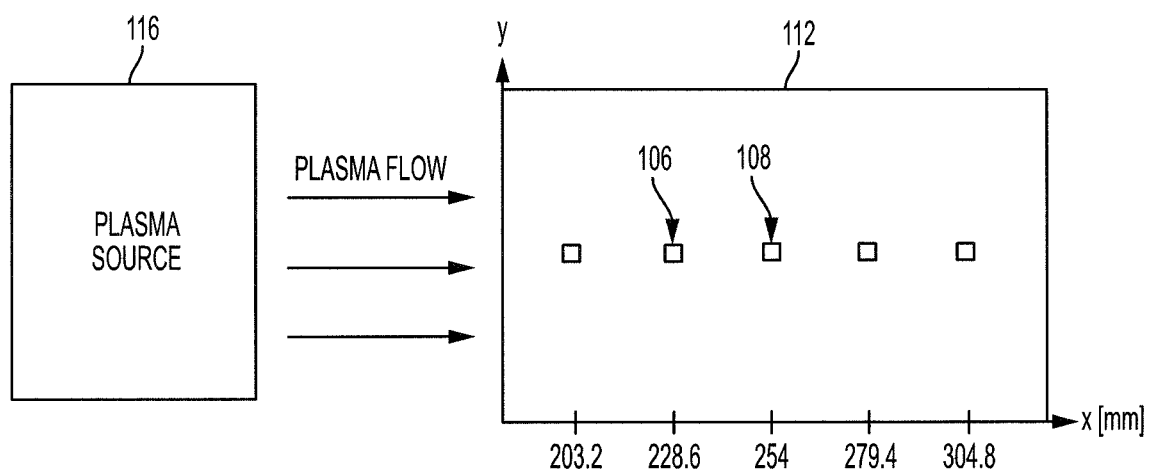
FIG. 3 is a top-down view of a support shelf of the system of FIG. 1 according to an embodiment of the present disclosure.

The potential at the dust layer surface was obtained by measuring the potentials of the conductive probes 106 (which included wires in the experiments) embedded in the dielectric material 114. Five 22-gauge polytetrafluoroethylene (PTFE) high-temperature stranded wires (i.e., probes 106) were inserted through the bottom of the support shelf 112 and along the centerline of the support shelf 112, as shown in FIG. 3. The wire insulation electrically isolated the wires from the aluminum plate, and the tips (i.e., first terminus 108) of each wire (i.e., each probe 106) were exposed to the plasma. Because the floating potential at the dust layer surface is determined by the current balance condition at the surface, the wires with exposed tips at the same level as the dust surface float to the same potential as the dust layer surface (i.e., surface of the dielectric material 114). Additional probes 106 were embedded inside the dielectric material 114 with the first terminus 108 exposed directly to the dielectric material 114 (see FIGS. 4A-4C). These embedded probes 106 provided qualitative information on the potential inside the dielectric material 114 but not the actual dust potentials as the contact resistance between the wire and the dust was not known. Similarly to the aluminum plate, each probe 106 (wire) was individually connected to a respective electrostatic receiver 104 placed outside the vacuum chamber 102, and the non-contact electrostatic voltmeter 120 measured the potential of each probe 106.

Figure 4A:
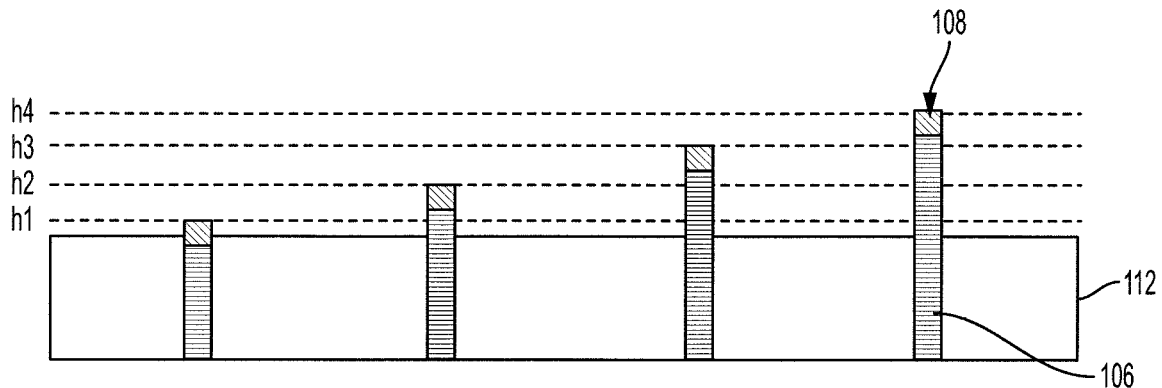
FIGS. 4A-4C are drawings illustrating exemplary probe heights and heights of dielectric material relative to a support shelf of the system of FIG. 1 according to an embodiment of the present disclosure.
Figure 4B:
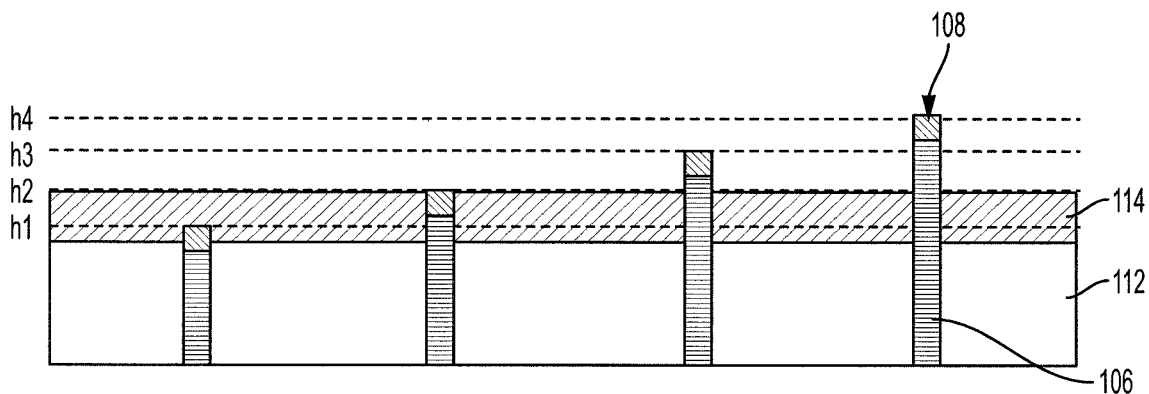
Figure 4C:
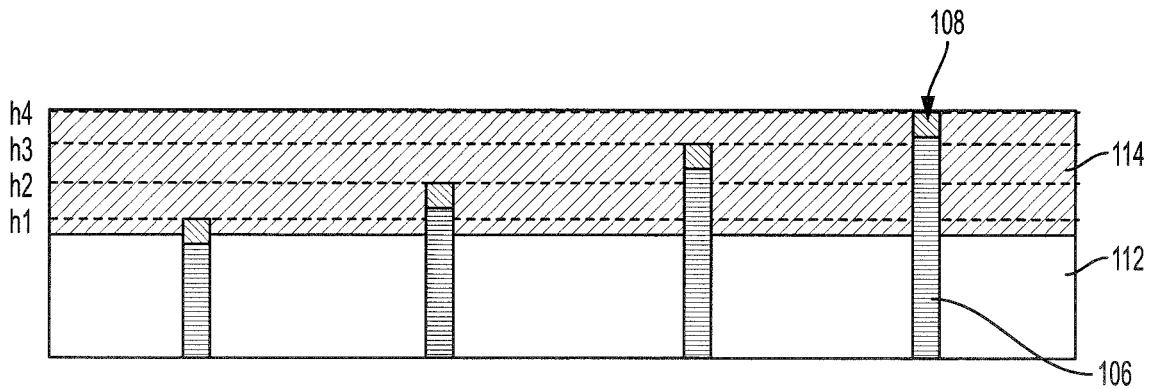
Figures 5, 6:
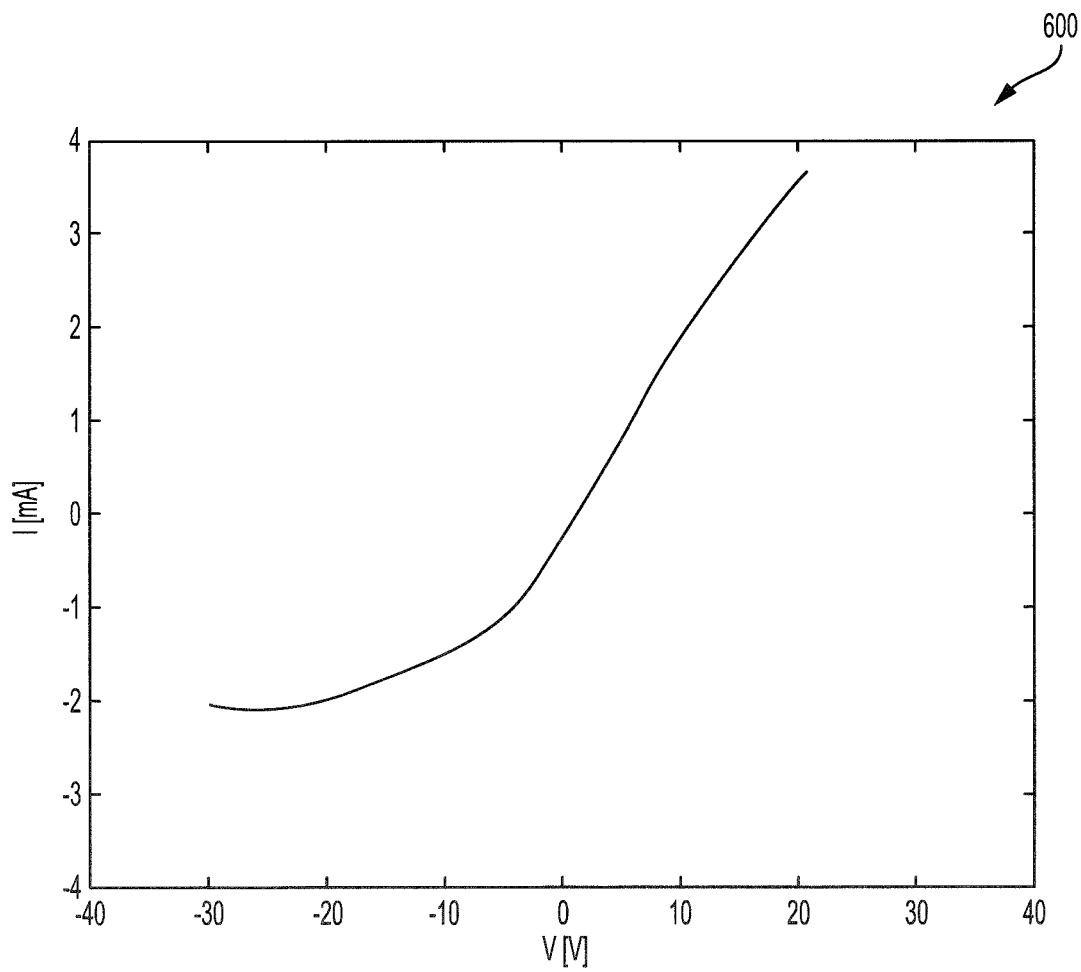
FIG. 5 is a table illustrating probe heights above a support shelf according to an embodiment of the present disclosure.
FIG. 6 is a graph illustrating voltage-current relationship of a clean support shelf according to an embodiment of the present disclosure.

FIGS. 4A-4C illustrate the position of the first terminus 108 of each probe 106 above the support shelf 112 as well as the two different dust layer thicknesses considered in the experiments. Four different wire heights (listed in a table 500 of FIG. 5) were used to measure the potential both inside the dust layer and just above the dust layer surface. Dusty plate 1 had a dust layer thickness of 0.063 inches (0.16 cm), which corresponded to the h2 wire level, and dusty plate 2 had a dust layer thickness of 0.126 in (0.32 cm), which corresponded to the h4 wire level. In each test, all probes 106 were placed at the same height. Hence, four different sample support shelves 112 were used for each dusty surface. To ensure that all wire tips were placed at the same height on each sample plate, four individual markers with thicknesses of h1, h2, h3, and h4, respectively, were made.

When inserting each wire through the bottom of the support shelf 112, a marker was used to line the tip of the wire with the top of the marker. Using the same marker for all wires on each sample plate ensured uniformity across all wires. To guarantee the dust thickness was uniform across all four sample plates, two stencils, 0.0632 inches and 0.126 inches (0.16 cm and 0.32 cm) thick, respectively, were developed. The error of the dust thickness was approximately 0.0020 inches (0.005 cm) to its respective height based on the stencil thickness tolerance. The stencil was placed around the support shelf 112, dust was set onto the surface of the support shelf 112, and a straight-edge was used to run along the stencil's surface, removing any excess dust and ensuring that the dust thickness on the support shelf 112 was uniform.

Measurement of the plasma environment in the vacuum chamber 102 showed that the Debye length around the support shelf 112 was on the order of 0.079 inches (2 mm). As the distance between the support shelf 112 and other objects in the chamber, such as the probes, is much larger than the sheath thickness surrounding the support shelf 112, support shelf 112 charging was not affected by the charging of other objects in the chamber.

Before each case was tested, the dust samples were held under vacuum and baked with a Watlowpolyimide sheet heater at 248 degrees Fahrenheit (120 degrees C.) for 18 hours to outgas residual moisture. To ensure that the charging of the Teflon wire insulation and Watlow polyimide sheet heater did not affect the charging of the samples, the following floating potentials were measured: a clean aluminum plate, a clean aluminum plate with a Watlow polyimide sheet heater, a clean aluminum plate with embedded PTFE wires, and a clean aluminum plate with both a Watlow polyimide sheet heater and embedded PTFE wires. The findings showed that the floating potential of all four samples were identical, which confirmed that the charge stored on the dielectrics did not distort the measurements. Moreover, the wires embedded in the dust layer were not exposed to plasma and thus would not affect the charging of the samples.

Prior to measuring dusty surface charging, it was necessary to first verify that the measurement plate potential measured by the non-contact electrostatic voltmeter 120 matched that of a target plate placed inside the vacuum chamber 102. Hence, first, the charging of a clean plate without dust was measured. A clean aluminum plate inside the vacuum chamber 102 was electrically connected to the electrostatic receiver 104 outside the vacuum chamber 102 with a PTFE insulated wire, as shown in FIG. 1, immersed in the plasma generated by the ion thruster, and its floating potential was measured by the non-contact electrostatic voltmeter 120. Two different floating potential measurement techniques were utilized to compare and validate the non-contact electrostatic voltmeter 120 measurement. The first technique was the floating point method. The aluminum plate was connected to ground through a resistor (R=119.1 ohms), the total current collected by the aluminum plate was measured (I), and the aluminum plate potential was calculated from the voltage drop across the resistor, V, using V=IR. The second technique was to measure the I-V curve (shown in a graph 600 of FIG. 6) of the electrostatic receiver 104. The electrostatic receiver 104 will float at a potential where the total ion and electron current collected is equal, resulting in zero current.

Figure 7:
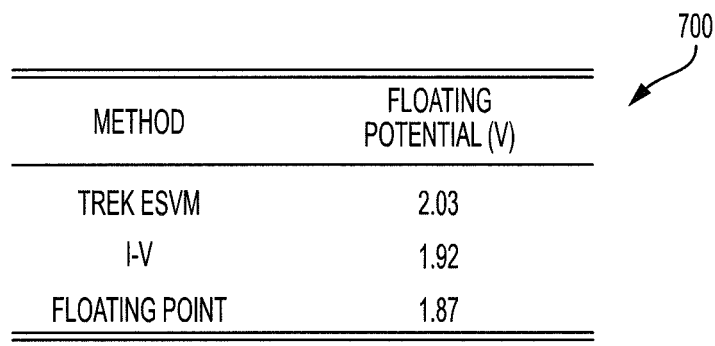
FIG. 7 is a table illustrating floating potential measurements according to an embodiment of the present disclosure.

A table 700, shown in FIG. 7, shows the results of the three different floating point measurement techniques with respect to ground. Results show that the floating point method and I-V curve both measure similar floating point potentials to the non-contact electrostatic voltmeter 120, which confirms that the floating potential of an object inside the vacuum chamber 102 can be determined by electrically connecting the object to an electrostatic receiver 104 outside the vacuum chamber 102 and measuring the electrostatic receiver 104 with a non-contact electrostatic voltmeter 120. To ensure that the potential drop across the wire was negligible, the target plate was artificially biased by a power source, and the potential of the measurement plate was measured by the non-contact electrostatic voltmeter 120. The findings illustrated that the potential drop across the wire was less than a hundredth of a volt.

Figure 8A:
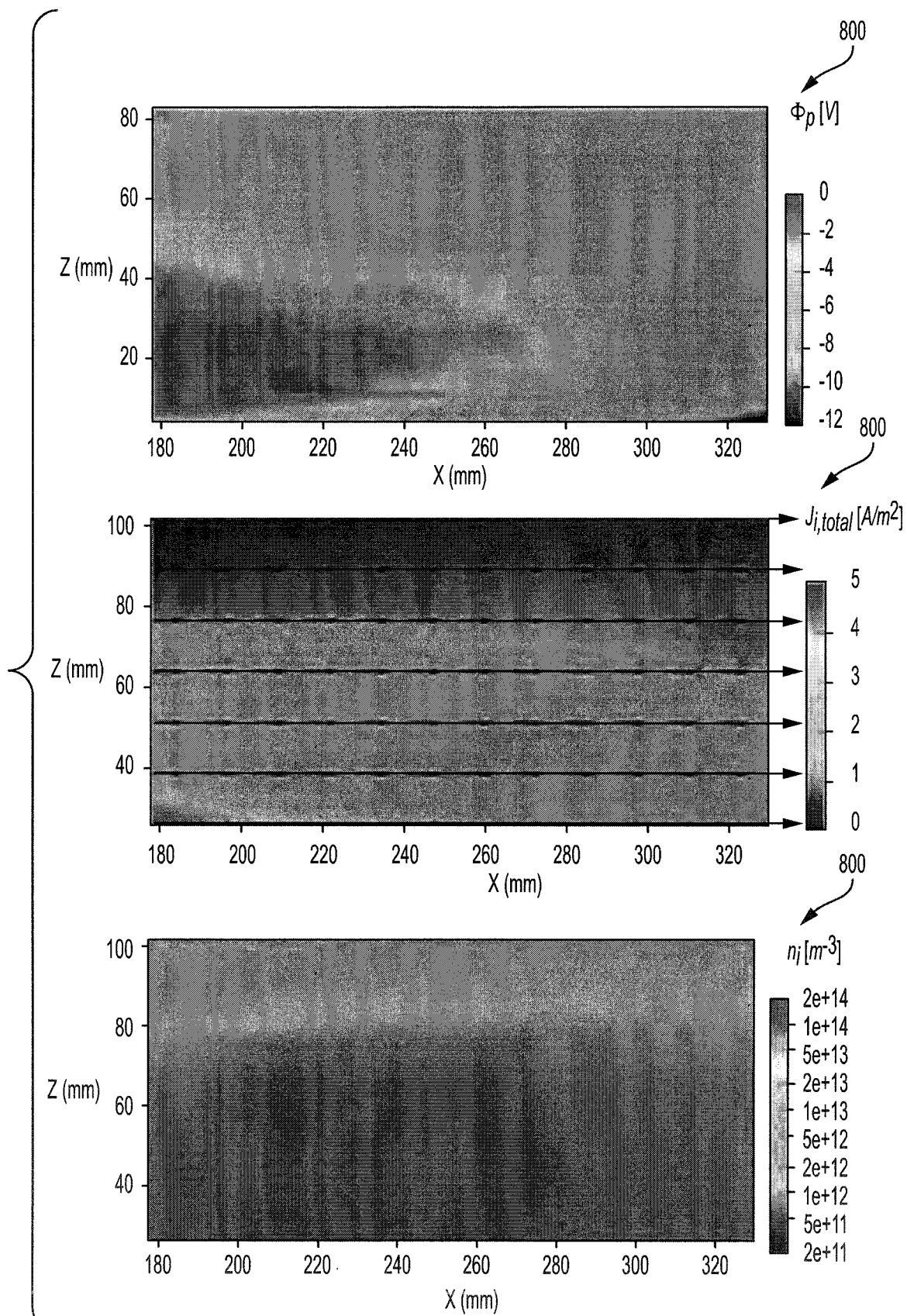
FIGS. 8A and 8B illustrate graphs showing plasma environments above a support shelf according to an embodiment of the present disclosure.
Figure 8B:
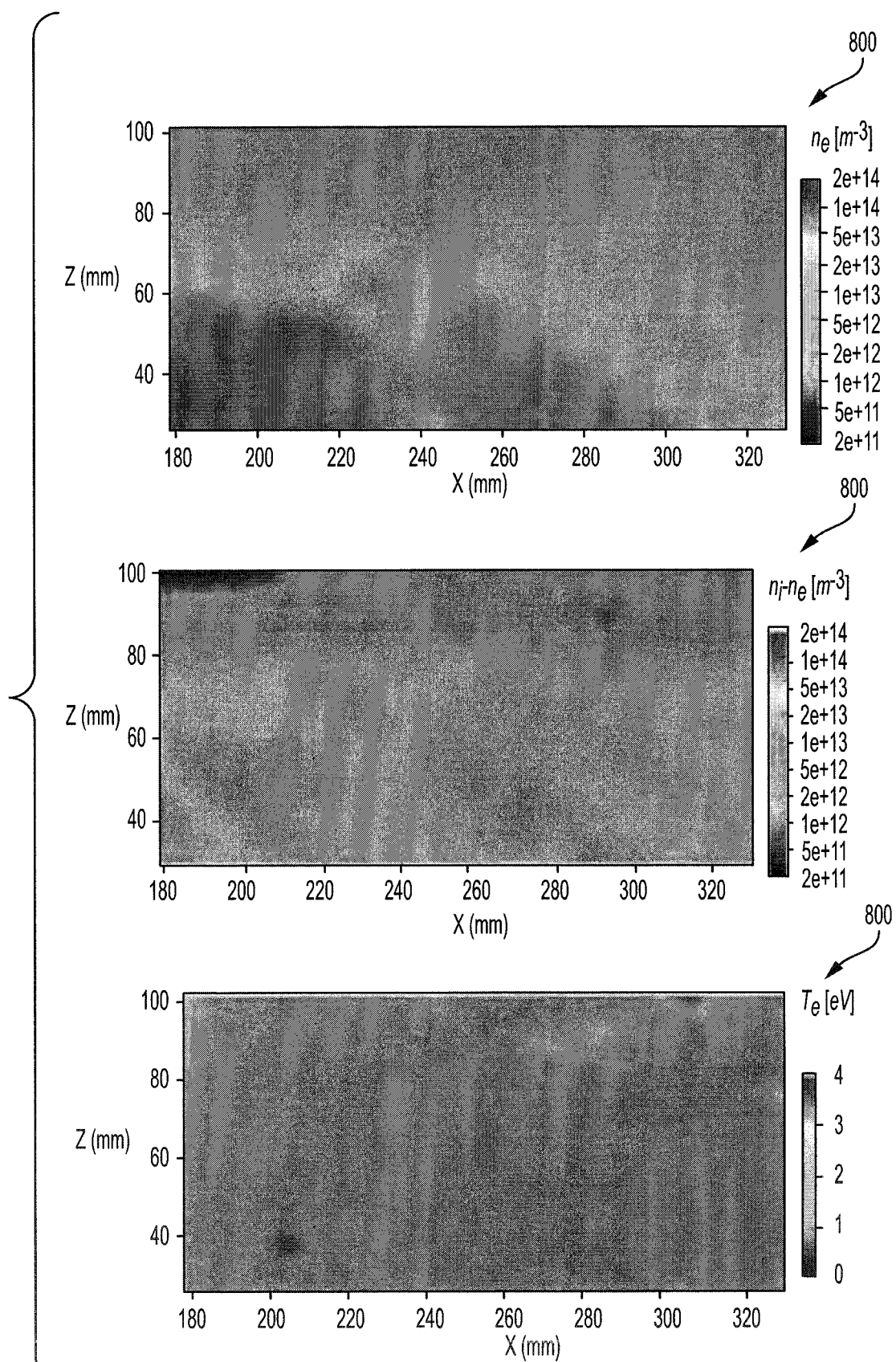

The plasma diagnostics discussed above were utilized to obtain a full set of plasma parameters. FIGS. 8A and 8B illustrate measured contour plots of the plasma potential, $\varphi_p$, current density, $J_i$, ion density, $n_i$, electron density, $n_e$, and space charge, $n_i-n_e$. Note that the closest measurements to the target sample were made at 1 inch (25.4 mm) above the surface, which aligns with the centerline of the plasma beam. The experiments used the measured potential at the source centerline above the leading edge of the plate (x=7.05 inches (179 mm) and z=1 inch (25.4 mm)) as the reference ambient potential. Given the design of the emissive probe, plasma potential measurements have an error of plus or minus 10%.

Figures 9, 10:
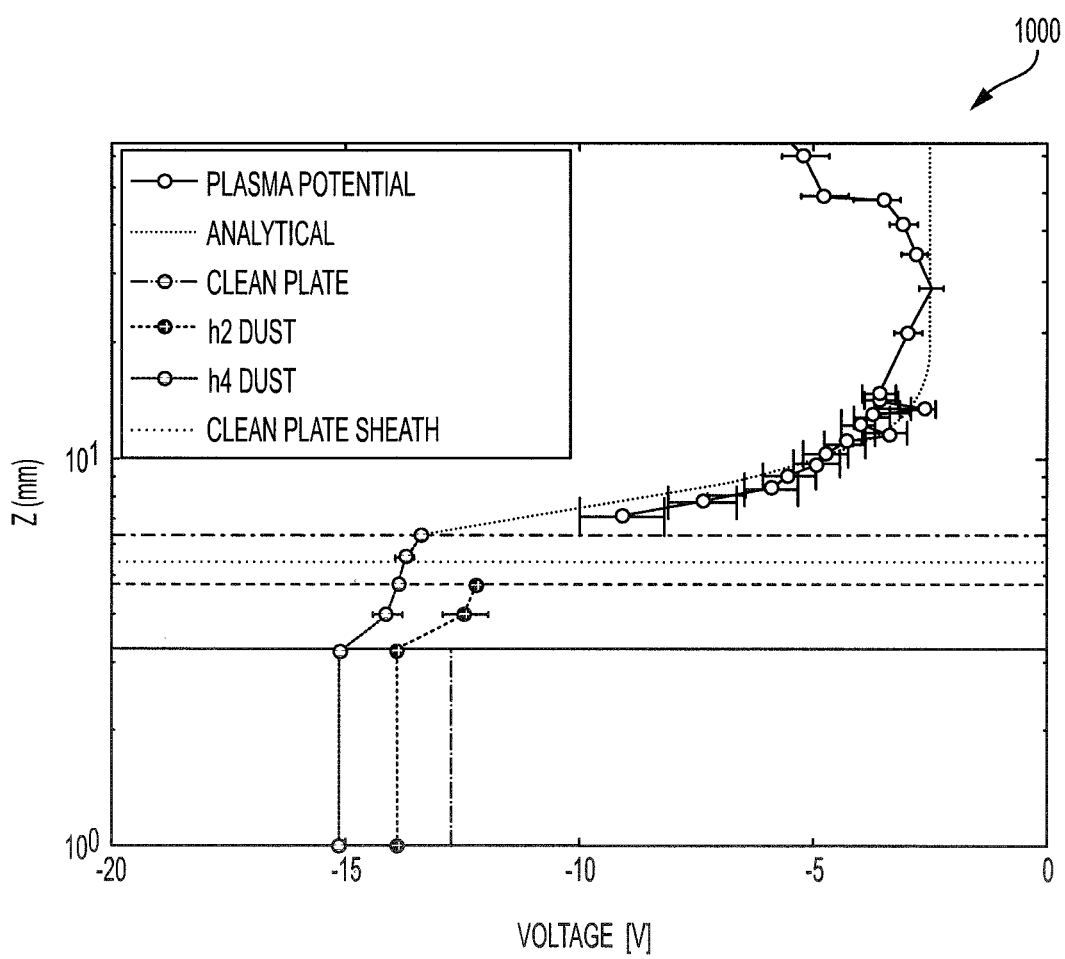
FIG. 9 is a table illustrating average ambient plasma parameters at various positions along a beam centerline according to an embodiment of the present disclosure.
FIG. 10 is a graph illustrating a 1 dimensional profile of ambient plasma and a support shelf along a z-direction at x=10 inches (254 centimeters) according to an embodiment of the present disclosure.

A table 900 of FIG. 9 shows the average measured plasma potential, ion density, electron density, and electron temperature at various x-positions along the beam centerline. From the measurements, it was discovered that the Debye length in the plasma environment is approximately $\lambda_D$=0.79 inches (2 mm). It is also see that the beam is non-neutral, and the ion density is an order of magnitude larger than the electron density at the front edge of the sample.

For the setup considered, the standard 1-D space-charge limited current collection analysis may be applied to estimate the surface floating potential with respect to the ambient, $\Phi_s$, and the sheath thickness, $d_{sh}$. Along the z-direction, a presheath accelerates the ambient cold ions to satisfy the Bohm sheath condition. Hence, the ions enter into the sheath with a Mach number, $M=v_{iz}/C_s=1$, where $$C_s = \sqrt{\frac{k_B T_e}{m_i}}$$

is the ion acoustic velocity and $k_B$ is the Boltzman constant. Therefore, the ion current collection along the z-direction toward the plate is approximately $J_i \approx en_{io}C_s$. The electron current outside the sheath is the thermal current. Hence, the 1-D current balance condition at the surface is given by Equation 1 below:

$$en_{io}C_s = \sqrt{\frac{k_B T_e}{2\Pi m_e}} e^{\frac{e\phi_s}{k_B T_e}} \quad \text{Equation 1}$$

And the sheath thickness may be given by Equation 2 below:

$$\frac{d_{sh}}{\lambda_D} \cong \left(\frac{4\sqrt{2}}{9}\left(-\frac{e\phi_s}{k_B T_e}\right)\right) \quad \text{Equation 2}$$

Using the average ion density, electron density, and electron temperature from the table 900 of FIG. 9, it was found that the surface potential was $\Phi_s \approx -9$ V with respect to the ambient reference and the sheath thickness to be $d_{sh} \approx 0.16$ inches (4 mm) above the sample plate.

Next, a uniform layer of JSC-1A was applied onto the support shelf 112. Two layer thicknesses were measured. The first layer has a thickness of 0.063 inches (0.16 cm). In this setup, the first terminuses 108 of the h1 probes 106 were embedded in the dust layer, the first terminuses 108 of the h2 probes 106. were at the dust surface, and the first terminuses 108 of the h3 and h4 probes 106 were above the dust surface. Then, another layer of JSC-1A was applied so that the total dust layer thickness was 0.126 inches (0.32 cm). In this setup, the first terminuses 108 of the h1, h2, and h3 probes 106 were all embedded within the dust layer, and the first terminuses 108 of the h4 probes 106 were at the dust surface.

Figure 11:
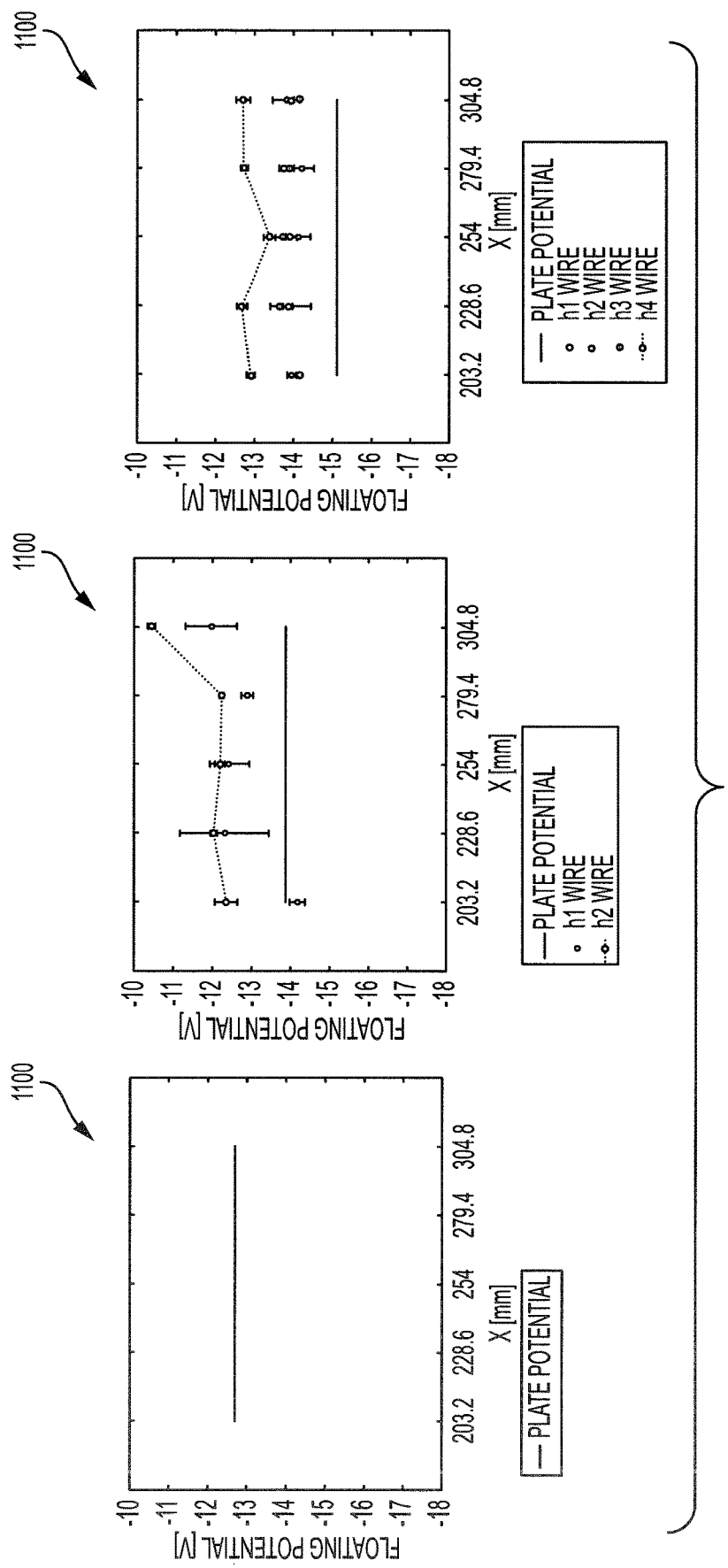
FIG. 11 shows graphs that illustrate sample potential within a dust layer measured by embedded wires of a clean plate, a plate with a dust thickness of h2, and a plate with dust thickness of h4 according to an embodiment of the present disclosure.

FIG. 10 is a plot 1000 illustrating the 1-D potential profile of the ambient plasma and sample plate along the z-direction at x=10 inches (254.0 mm). The potentials above the dust layer were measured by the emissive probe, and the potentials inside or near the dust layer were measured by the embedded wires. The floating potential of the aluminum plate was measured by the non-contacting electrostatic ESVM. FIG. 11 illustrates plots 1100 showing the floating potential of the target plate along the x-direction. For comparison, the potentials of the clean plate and the two dusty plates were plotted. As stated above, the potentials measured for the plate and that of the dust surface represent the actual floating potential, while the potentials measured for locations inside the dust layer are considered qualitative. The potential profiles show that the potential inside the dust layer becomes more negative with increasing depth. The floating potential of the conducting plate and the average floating potential of the dust surface for all three cases are shown in a table 1200 of FIG. 12. Not surprisingly, the potential of the clean plate and of the two dusty surfaces are all very similar. This is to be expected because the surface charging potential is controlled by the current balance condition. It is noted, however, that this potential is more negative relative to the charging calculation based on the measured ambient plasma parameters. This is due to the non-neutral beam generated by the plasma source.

The error bars on the dust layer potentials were calculated by dividing the standard deviation by the square root of the sample size. Each test setup was run four times, and each probe was measured 18 times per run for a total of 72 measurements per probe per test setup.

The results show that the existence of a dust layer drives the plate potential more negative with respect to the ambient. This is to be expected. Assuming the dust layer is a parallel plate capacitor, it was found that the relation between the dust surface potential and plate potential can be modeled by Equation 3 below.

$$C_{parallel} = \epsilon_0 \epsilon_{rd} A/d; \ Q = C(\Phi_s - \Phi_{plate})$$ Equation 3:

In Equation 3, $\epsilon_0$ is the permittivity of free space, $\epsilon_{rd}$ is the relative permittivity of JSC-1A (~4.29), A is the overlapping area between the dust layer and aluminum plate, d is the dust thickness, $\Phi_s$ is the dust surface potential, and $\Phi_{plate}$ is the plate potential. Because $\Phi_s$ is determined by current collection from the ambient plasma, the charge stored in the dust layer drives $\Phi_{plate}$ more negative. Not surprisingly, as the dust layer thickness increases, the difference between the dust surface potential and the plate also increases linearly.

From the measured potential difference between the dust layer surface and plate, the charge deposited on the dust layer, Q, can also be estimated from Equation 3. Because there is little charge transfer between the dust grains, the collected charge is distributed on the dust layer surface. Therefore, the average charge accumulated on a single dust grain with a radius $r_d$ on the dust surface is given by Equation 4 below.

$$Q_d = \sigma \pi r_d^2; \ \sigma = \frac{Q}{A} = \frac{C(\phi_s - \phi_{plate})}{A}$$ Equation 4

A table 1300 of FIG. 13 shows the estimated total charge deposited on the dust layer, Q, the average charge density of the dust surface, and the average charge per dust grain on the dust layer surface, $Q_d$. If the dust grains were isolated, then the charge accumulated on a single, isolated dust grain with the same radius and dust potential would be $Q_{d,iso} = 4\pi\epsilon_0\epsilon_{rd}\Phi_s$ by assuming a spherical dust grain. It was found that such a calculation would lead to a charge per dust grain of approximately $Q_{d,iso} \sim -1.5 \times 10^6 e$, where e is the elementary charge ($1.6 \times 10^{-19}$ C), which is about three orders of magnitude larger than that of a charge per dust grain on a dusty surface. This is in agreement with previous results.

Figure 14:
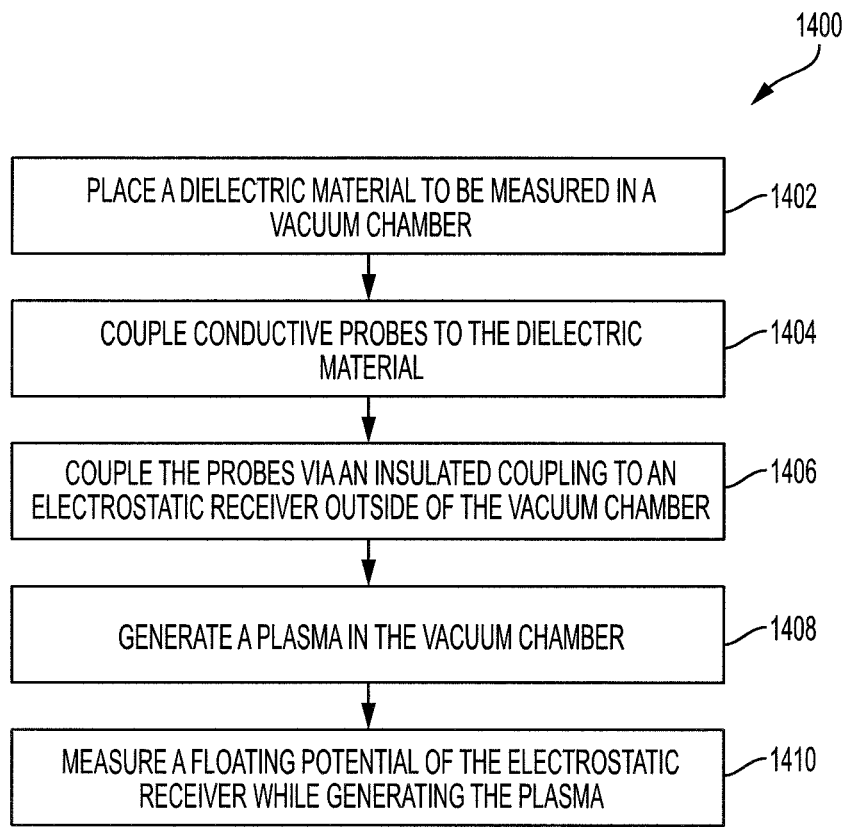
FIG. 14 is a flowchart illustrating a method for voltage measurement of a dielectric material in plasma according to an embodiment of the present disclosure.

Turning now to FIG. 14, a method 1400 for voltage measurement of a dielectric material, such as dust, in plasma is shown. In block 1402, a dielectric material (such as dust) to be measured may be placed in a vacuum chamber. For example, the dielectric material may be located on a support shelf in a vacuum chamber such as the support shelf 112 in the vacuum chamber 102 of FIG. 1.

In block 1404, one or more conductive probe may be coupled to the dielectric material. For example, a first terminus of a wire may be exposed and in contact with the dielectric material, with the remainder of the wire surrounded by an insulating sheath, such as PTFE.

In block 1406, the conductive probes may be coupled via an insulated coupling to an electrostatic receiver (such as the electrostatic receiver 104 of FIG. 1) that is located outside of the vacuum chamber.

In block 1408, plasma may be generated in the vacuum chamber. For example, a plasma source similar to the plasma source 116 of FIG. 1 may be used to generate the plasma.

In block 1410, a floating potential of the electrostatic receiver may be measured while the plasma is being generated. For example, the floating potential may be measured using a non-contact electrostatic voltmeter such as the noncontact electrostatic voltmeter 120 of FIG. 1. The floating potential may correspond to the potential of the dielectric material in the vacuum chamber.

In summary, a laboratory study was carried out to measure the charging of a conducting surface covered by a thin layer of lunar dust simulant JSC-1A in plasma. The floating potentials of the dust layer and the plate beneath the dust layer were obtained by utilizing embedded wires connected to a measurement plate outside a vacuum chamber and measured by a Trek™ non-contacting ESVM. This is the first known direct method to measure the charging of a dust covered surface in plasma. The disclosure found that the floating potential of a dust covered conducting plate is dependent on both the plasma current collection and the dust layer thickness. The current balance condition controls the dust surface potential, and the dust layer acts as a capacitor between the exposed dust surface and the plate underneath the dust. Hence, the dust layer will drive the potential of the plate beneath it further negative with respect to the ambient. This disclosure is directly applicable to spacecraft charging in a dusty plasma environment found around airless planetary bodies, such as comets, certain asteroids, the Moon, and Mars. In such environments, dust deposition on spacecraft surface will enhance plasma charging and, thus, the risk of discharge and arcing. Although the present experiments carried out in this study only considered a moderate plasma charging condition, the disclosure is equally applicable to more severe charging conditions.

Exemplary embodiments of the methods/systems have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. A system for voltage measurement of dielectric material in plasma comprising:
   a vacuum chamber;
   an electrostatic receiver located outside of the vacuum chamber;
   a conductive probe having a first terminus in contact with the dielectric material in the vacuum chamber and a second terminus in electrical communication with the electrostatic receiver; and
   a non-contact electrostatic voltmeter configured to measure a floating potential of the electrostatic receiver that corresponds to a dielectric potential of the dielectric material at a location in contact with the first terminus of the conductive probe.

2. The system of claim 1 wherein the conductive probe is supported such that the first terminus is coplanar with an exposed surface of the dielectric material in the vacuum chamber.

3. The system of claim 2 further comprising a second conductive probe having a first terminus in contact with the dielectric material and located below the exposed surface of the dielectric material, and a second terminus in electrical communication with the electrostatic receiver.

4. The system of claim 1 wherein the electrostatic receiver includes a metal plate supported by an insulating material.

5. The system of claim 1 wherein the conductive probe includes a wire.

6. The system of claim 1 wherein the conductive probe is insulated except at the first terminus.

7. The system of claim 1 further comprising a support shelf located in the vacuum chamber, configured to support the dielectric material, and defining an opening for receiving the first terminus of the conductive probe.

8. The system of claim 1 further comprising a plasma source configured to generate plasma into the vacuum chamber.

9. The system of claim 8 wherein the plasma source is configured to direct the plasma in a direction parallel to a surface of the dielectric material.

10. The system of claim 1 further comprising the dielectric material, wherein the dielectric material includes dust grains that simulate dust in outer space.

11. A method for voltage measurement of a dielectric material in plasma comprising:
   placing the dielectric material in a vacuum chamber;
   positioning a conductive probe such that a first tell sinus of the conductive probe is in contact with the dielectric material;
   coupling a second terminus of the conductive probe to an electrostatic receiver outside of the vacuum chamber;
   generating plasma in the vacuum chamber; and
   measuring a voltage of the dielectric material at the electrostatic receiver using a non-contact electrostatic voltmeter.

12. The method of claim 11 wherein positioning the conductive probe such that the first terminus of the conductive probe is in contact with the dielectric material includes positioning multiple conductive probes such that the first terminus of each of the multiple conductive probes is in contact with the dielectric material, with the first terminus of at least one of the multiple conductive probes being closer to a surface of the dielectric material than the first terminus of at least another of the multiple conductive probes.

13. The method of claim 11 wherein generating the plasma in the vacuum chamber includes directing the plasma in a direction parallel to a surface of the dielectric material.

14. The method of claim 11 wherein positioning the conductive probe such that the first terminus of the conductive probe is in contact with the dielectric material includes positioning the first terminus of the conductive probe to be coplanar with an exposed surface of the dielectric material.

15. The method of claim 11 wherein placing the dielectric material in the vacuum chamber includes positioning the dielectric material on a support shelf located in the vacuum chamber that defines an opening for receiving the conductive probe.

16. The method of claim 11 wherein the dielectric material includes dust grains that simulate dust in outer space.

17. A system for voltage measurement of dielectric material in plasma comprising:
   a vacuum chamber;
   a support shelf located in the vacuum chamber and configured to support the dielectric material;
   a plasma source configured to generate plasma into the vacuum chamber;
   an electrostatic receiver located outside of the vacuum chamber;
   a first conductive probe having a first terminus in contact with the dielectric material in the vacuum chamber and a second terminus in electrical communication with the electrostatic receiver; and
   a non-contact electrostatic voltmeter configured to measure a floating potential of the electrostatic receiver that corresponds to a dielectric potential of the dielectric material at a location in contact with the first terminus of the first conductive probe.

18. The system of claim 17 wherein the support shelf defines an opening for receiving the first terminus of the first conductive probe.

19. The system of claim 17 wherein the electrostatic receiver includes a metal plate supported by an insulating material.

20. The system of claim 17 further comprising a second conductive probe having a first terminus in contact with the dielectric material and located below an exposed surface of the dielectric material, and a second terminus in electrical communication with the electrostatic receiver, wherein the first terminus of the first conductive probe is coplanar with the exposed surface of the dielectric material.

* * * * *